United States Patent [19]

Seipel et al.

[11] 3,854,102

[45] Dec. 10, 1974

[54] MULTIPLE FREQUENCY BAND FREQUENCY SYNTHESIZER

[75] Inventors: Arnold J. Seipel, Plantation, Fla.; Basil C. Thompson, Hopatcong, N.J.; Robert H. Haussmann, Wayne, N.J.; Jerome Deutsch, New Milford, N.J.

[73] Assignee: International Telephone and Telegraph Corporation, Nutley, N.J.

[22] Filed: Aug. 9, 1973

[21] Appl. No.: 387,079

[52] U.S. Cl. .................... 331/1 A, 328/18, 331/15, 331/25, 331/60, 331/76, 331/77, 331/183

[51] Int. Cl. ........................ H03b 3/04, H03b 19/00

[58] Field of Search ........... 331/1 A, 15, 18, 25, 60, 331/76, 77, 183; 328/17, 18

[56] References Cited

UNITED STATES PATENTS

| | | | |
|---|---|---|---|
| 2,354,800 | 8/1944 | Deal | 328/18 |
| 3,130,376 | 4/1964 | Ross | 331/1 A |
| 3,611,175 | 10/1971 | Boelke | 331/25 X |

*Primary Examiner*—John Kominski
*Assistant Examiner*—Siegfried H. Grimm
*Attorney, Agent, or Firm*—John T. O'Halloran; Menotti J. Lombardi, Jr.; Alfred C. Hill

[57] ABSTRACT

There is disclosed herein a dual frequency band frequency synthesizer employing a single phase locked loop to control the frequency of the output signal of a voltage controlled oscillator so as to provide signals having a selected frequency in a selected one of the two frequency bands with the frequency of the signals in each of the two frequency bands having different incremental frequency steps. The phase locked loop includes therein a programmable binary divider having a different range of division factors for each of the two frequency bands with the output of the programmable divider being coupled directly to the phase detector of the phase locked loop when the lower frequency band is selected and through a modulo-6 binary counter when the higher frequency bands is selected. The programmable binary divider is programmed by frequency setting switches which produces 9's complement binary coded output for each of the selected decimal values. The coded decimal values of each of the frequency selecting switches are employed directly or through a decoding circuit to select the appropriate one of the two frequency bands, to program the programmable binary diver to the proper division factor for the frequency selected by the frequency setting switches and to bypass or incorporate the modulo-6 counter. The decoding circuit includes binary adders coupled to each of the switches intermediate the most significant switch and the least significant switch so as to add in digital form a first given constant value to the digital output of the switches when operating in the lower of the frequency bands and a second constant value in digital form when operating in the higher of the frequency bands so as to provide the proper division factor for the programmable binary divider for the frequency selected by the frequency setting switches. An automatic level control arrangement is also incorporated in the phase locked loop responding to the output signal in each frequency band to maintain a constant amplitude of output signal in each of the frequency bands.

32 Claims, 5 Drawing Figures

PATENTED DEC 10 1974

3,854,102

MULTIPLE FREQUENCY BAND FREQUENCY SYNTHESIZER

BACKGROUND OF THE INVENTION

This invention relates to frequency synthesizers and more particularly to multiple frequency band frequency synthesizers.

Known prior art multiple frequency band frequency synthesizers incorporate a phase locked loop for each of the frequency bands involved.

SUMMARY OF THE INVENTION

An object of the present invention is the provision of a multiple frequency band frequency synthesizer employing a single phase locked loop common to each of the frequency bands involved.

Another object of the present invention is the provision of a multiple frequency band frequency synthesizer employing a single phase locked loop common to each of the frequency bands involved, wherein the phase locked loop provides a different constant incremental frequency step for each of the frequency bands involved.

A feature of the present invention is the provision of a frequency synthesizer to generate one at a time a plurality of first signals each having a different selected frequency in each of a plurality of different frequency bands comprising: a voltage controlled oscillator capable of generating one at a time a plurality of second signals each having a different frequency in a given frequency band common to and predeterminedly related to the plurality of different frequency bands, the frequencies of the second signals being predeterminedly related to the frequencies of the first signals in each of the plurality of different frequency bands; first means coupled to the output of the oscillator to provide one at a time the plurality of first signals in each of the plurality of different frequency bands; and a single phase locked loop coupled between the input and output of the voltage controlled oscillator to control the generation of the plurality of second signals; the phase locked loop including second means to select the frequency of each of the first signals at the output of the first means, the frequencies of the first signals having a different constant incremental frequency step in each of the plurality of frequency bands.

Another feature of the present invention is to provide as the above-mentioned second means a programmable binary divider whose division factor N is selected in accordance with the selection of the frequency of the first signal to be generated, the frequency factor N of the programmable binary divider having a different range of values for each of the frequency bands involved.

BRIEF DESCRIPTION OF THE DRAWING

The above-mentioned and other features and objects of this invention will become more apparent by reference to the following description taken in conjunction with the accompanying drawing, in which.

DESCRIPTION OF THE PREFERRED EMBODIMENT

In the description that follows various values of frequencies, division factors and multiplication factors for a dual frequency band frequency synthesizer will be specifically set forth for purposes of explanation. However, it should be kept in mind that the techniques described hereinbelow can be employed employing other frequency values, other division factors other multiplication factors and/or to provide a frequency synthesizer having more than two frequency bands.

Figure 1:
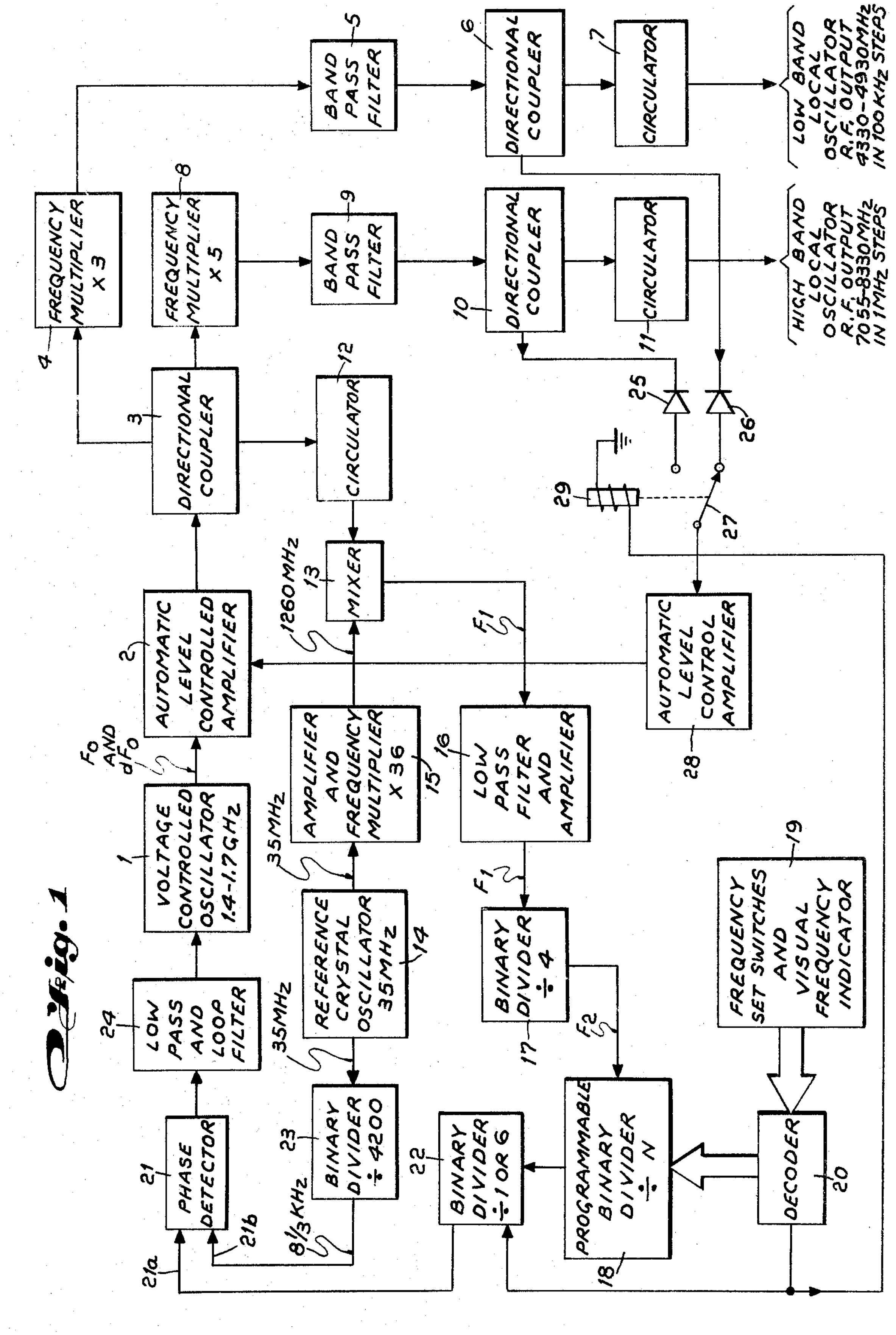
FIG. 1 is a block diagram illustrating a dual frequency band frequency synthesizer in accordance with the principles of the present invention.

Referring to FIG. 1 the dual frequency band frequency synthesizer of the present invention includes a voltage controlled oscillator 1 which is controlled by a single phase locked loop to provide signals having frequencies Fo in a frequency range of 1.4 – 1.7 GHz (gigahertz). The incremental frequency step dFo for the signals produced by oscillator 1 has a certain constant value for the LO (low) frequency band and a different constant value for the HI (high) frequency band. The output signal of oscillator 1 having a selected frequency Fo is coupled through an automatic level controlled amplifier 2 to a directional coupler 3. The selected frequency for the LO band appears at the output of a series circuit coupled to coupler 3 including frequency multiplier 4 having a multiplication factor of three and band pass filter 5 which defines the frequency range of the LO band frequency output. The output of filter 5 is coupled to directional coupler 6 and, hence, to a circulator 7 to provide the LO band signal having a frequency in the LO band frequency range of 4,330–4,930 MHz (megahertz) with a constant incremental frequency step between adjacent frequencies of 100 KHz (kilohertz). The HI band signal output appears at the output of a series circuit coupled to coupler 3 including frequency multiplier 8 having a multiplication factor of five and band pass filter 9 which defines the frequency range of the HI band frequency output. The output of filter 9 is coupled to directional coupler 10 and, hence, to circulator 11. The signals in the HI frequency band have frequencies in the frequency range of 7,055–8,330 MHz with a constant incremental frequency step between adjacent frequencies of 1 MHz.

The frequency controlling phase locked loop for oscillator 1 includes a circulator 12 coupled to the output of coupler 3. The output of circulator 12 is coupled to mixer 13 which receives its other input from a reference crystal oscillator 14 and amplifier and frequency multiplier 15. Oscillator 14 produces a signal having a frequency of 35 MHz which is amplified and frequency multiplied by a frequency factor of 36 in amplifier and frequency multiplier 15. The difference frequency present in mixer 13, namely, frequency F1, is coupled to low pass filter and amplifier 16 and, hence, to a binary frequency divider 17 having a division factor of four to provide an output signal F2. The output of divider 17 is coupled to a binary frequency divider arrangement which provides the primary control for the frequency Fo of the signals generated by oscillator 1 to provide the desired signal having a frequency in the selected one of the LO and HI frequency band outputs of the frequency synthesizer. This frequency dividing arrangement includes programmable binary divider 18 having a division factor of N which is selected by frequency set switches and visual frequency indicator 19 and decoder 20. When the frequency set in switches 19 is a frequency in the LO frequency band, decoder 20 detects this fact and causes the divided frequency output of divider 18 to be directly coupled to a first input 21a of phase detector 21. When the frequency set in switches 19 is a frequency in the HI frequency band, decoder 20 will detect this fact and will cause the divided frequency output of divider 18 to be further divided in binary divider 22 by a division factor of six with the output from divider 22 being coupled to the first input 21*a* of phase detector 21. The reference input applied to input 21b of phase detector 21 is provided by the output signal of reference crystal oscillator 14 which is frequency divided by a division factor of 4200 in binary frequency divider 23. The frequency control output of phase detector 21 is then passed through a low pass filter and loop filter 24 to a control input of oscillator 1 to control the frequency Fo of the output signal of oscillator 1. The various values of the different identified frequencies, incremental frequency step and the values of N for each of the LO and HI frequency bands is set forth in TABLE I hereinbelow for the specific embodiment being described for purposes of explanation.

TABLE I

| | LOW BAND (4GHz) | HIGH BAND (8GHz) |
|---|---|---|
| Fo | 1443.⅓ to 1643.⅓ MHz | 1411 to 1666 MHz |
| dFo | 33.⅓ KHz | 200 KHz |
| F1 | 183.⅓ to 383.⅓ MHz | 151 to 406 MHz |
| F2 | 45.83 to 95.83 MHz | 37.75 to 101.5 MHz |
| $N_{MIN}$ | 5,500 | 755 |
| $N_{MAX}$ | 11,500 | 2,030 |
| FREQ SET | 4400.0 to 5000.0 MHz | 125 to 8400 MHz |
| ≈ 1 OR ≈ 6 | ≈ 1 | ≈ 6 |

It should be noted that each of the frequencies in the two frequency bands set in switches 19 differ from the output frequency by a constant 70 MHz value. The purpose of this 70 MHz offset between the frequency selected by switches 19 and the actual output signal in each of the frequency bands is for the reasons that the signals having frequencies in the two frequency bands are used as local oscillator signals which will provide a 70 MHz IF (intermediate frequency) signal when mixed with a RF (radio frequency) signal in both the receiver and a transmitter. Therefore, if an operator desires to receive or transmit a particular RF signal all the operator has to do is set switches 19 to the desired RF frequency and the local oscillator signal will be provided by the frequency synthesizer of this invention without any external computations. If the frequency selected by switches 19 corresponds directly to the frequency of the signals being generated in both the LO and HI frequency bands, it would be necessary for the operator to make a calculation to determine the value of the local oscillator signal necessary to receive or transmit a given RF signal with a desired IF signal.

As mentioned hereinabove the output signal of oscillator 1 is coupled to amplifier 2 which is capable of controlling the level of the output signals of oscillator 1. The control signal to control the level or gain of the signals in amplifier 2 is provided by providing a level detector coupled to the output of each of the frequency bands, such as diode 25 coupled to coupler 10 and diode 26 coupled to coupler 6. With switch 27 in the position illustrated a level control signal will be produced for the LO frequency band and will be coupled through automatic level control amplifier 28, the output of which is coupled to the control input of amplifier 2. When decoder 20 detects a frequency from switches 19 in the HI frequency band, relay 29 is energizes to move switch 27 to its other contact thereby coupling diode 25 to amplifier 28. In this way a level control signal is produced for the HI frequency band which is amplified in amplifier 28 prior to being coupled to the control input of amplifier 2.

Figures 2, 3:
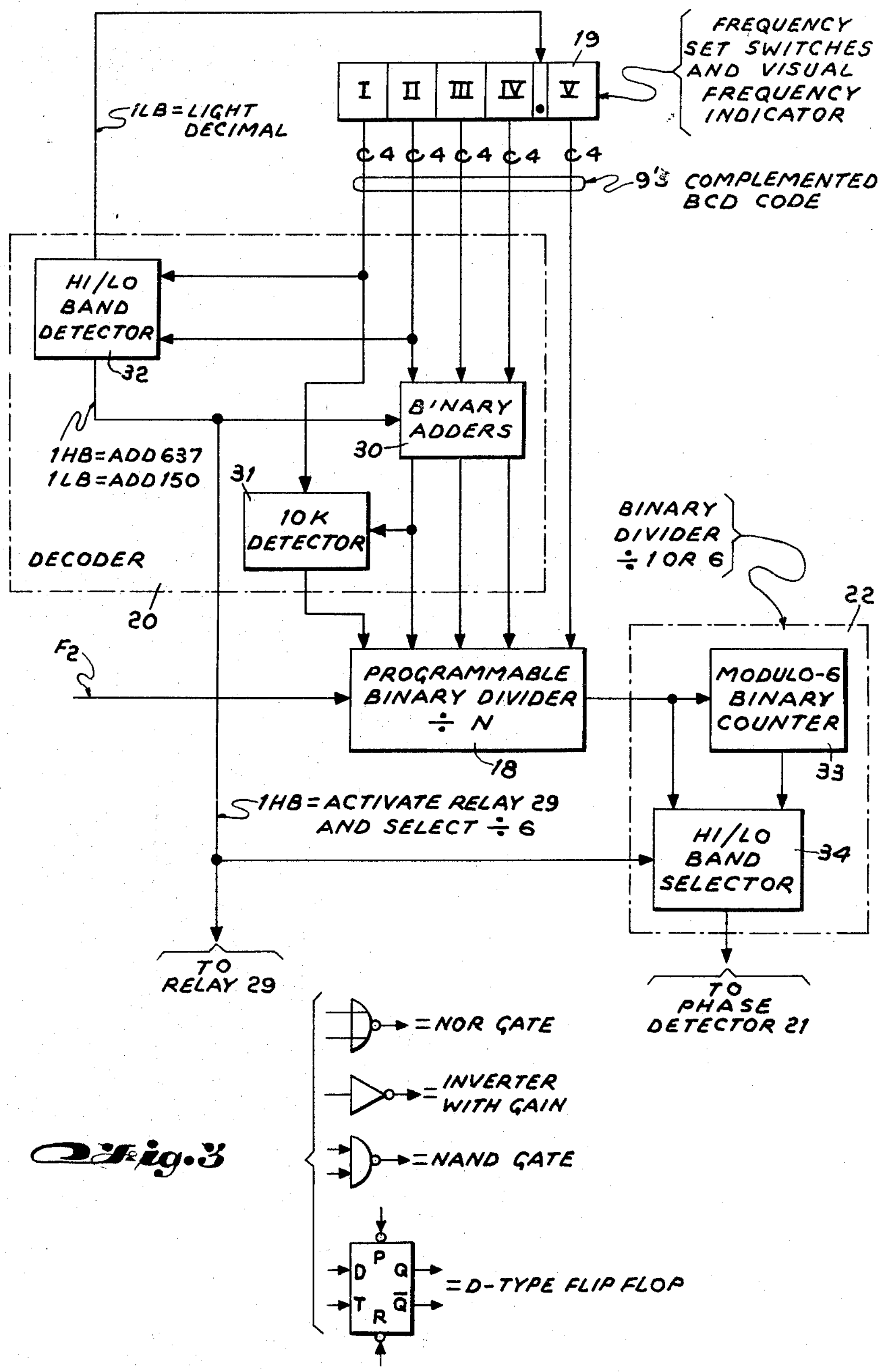
FIG. 2 is a block diagram of the programmable binary divider, the divide by one or divide by six binary divider, the decoder and the frequency set switches and visual frequency indicator of FIG. 1.
FIG. 3 is a diagram illustrating the logic symbols employed in FIGS. 4 and 5.

Referring to FIG. 2 there is illustrated therein in greater detail switches 19 and decoder 20 as coupled to programmable binary divider 18 and binary divider 22. Programmable divider 18 is controlled by means of five thumbwheel switches I-V of switches 19. Divider 18 must divide the input frequency F2 by a number N as determined by the decimal frequency setting of switches I–V as indicated in TABLE II.

TABLE II

| SWITCH SETTING (MHz) I | II | III | IV | V | N | ≈ 6 | F2 (MHz) | AND |
|---|---|---|---|---|---|---|---|---|
| 4 | 4 | 0 | 0 | .0 | 5500 | OUT | 45.83 | LO |
| 4 | 4 | 0 | 0 | .1 | 5501 | | | |
| ' | ' | ' | ' | ' | ' | | | |
| ' | ' | ' | ' | ' | ' | | | |
| ' | ' | ' | ' | ' | ' | | | |
| 4 | 9 | 9 | 9 | .9 | 11,499 | | ↓ | |
| 5 | 0 | 0 | 0 | .0 | 11,500 | ↓ | 95.83 | ↓ |
| | 7 | 1 | 2 | 5 | 755 | IN | 37.75 | HI |
| | 7 | 1 | 2 | 6 | 756 | | | |
| | ' | ' | ' | ' | | | | |
| | ' | ' | ' | ' | | | | |
| | ' | ' | ' | ' | | | | |
| | 8 | 3 | 9 | 9 | 2029 | | ↓ | |
| | 8 | 4 | 0 | 0 | 2030 | ↓ | 101.50 | ↓ |

As indicated in TABLE II there is an additional divide-by-six function required in the HI band only as provided by divider 22.

For the LO frequency band, it can be seen that the division factor N is the decimal number set in switches II-V plus a constant value of 1500. For instance, for 4,400.0, N = x4,000 + 1,500 = 5,500 or, the complete output of switches I–V can be taken and add thereto (−40,000 + 1,500). The decimal point is ignored. This is accomplished simply by ignoring the coded decimal output of switch I and using coded decimal output of switch V together with the coded decimal outputs of switches II–IV.

Switches II–V are standard switches produced by Digitran Company identified by the model number 2649. These switches have a window through which the decimal digit select is visible. In addition these switches produce a 9's complemented binary coded decimal (BCD) code signal for each decimal digit dialed. A standard BCD code and a 9's complemented BCD code are illustrated in TABLE III.

TABLE III

| DECIMAL | BINARY CODED DECIMAL (BCD) CODE | | | | 9's COMPLEMENTED BCD CODE | | | |
|---|---|---|---|---|---|---|---|---|
| | W8 | W4 | W2 | W1 | W8 | W4 | W2 | W1 |
| 0 | 0 | 0 | 0 | 0 | 1 | 0 | 0 | 1 |
| 1 | 0 | 0 | 0 | 1 | 1 | 0 | 0 | 0 |
| 2 | 0 | 0 | 1 | 0 | 0 | 1 | 1 | 1 |
| 3 | 0 | 0 | 1 | 1 | 0 | 1 | 1 | 0 |
| 4 | 0 | 1 | 0 | 0 | 0 | 1 | 0 | 1 |
| 5 | 0 | 1 | 0 | 1 | 0 | 1 | 0 | 0 |
| 6 | 0 | 1 | 1 | 0 | 0 | 0 | 1 | 1 |
| 7 | 0 | 1 | 1 | 1 | 0 | 0 | 1 | 0 |
| 8 | 1 | 0 | 0 | 0 | 0 | 0 | 0 | 1 |
| 9 | 1 | 0 | 0 | 1 | 0 | 0 | 0 | 0 |

TABLE IV illustrates the outputs of each of the switches II-V depending upon the dial setting.

TABLE IV

| DIAL SETTING | VISIBLE MARK | OUTPUT: COMMON "1" CONNECTED TO TERMINALS | | | | OUTPUT: COMMON "0" CONNECTED TO TERMINALS | | | |
|---|---|---|---|---|---|---|---|---|---|
| | | W1 | W2 | W4 | W8 | W1 | W2 | W4 | W8 |
| 0 | 0 | X | | | X | | X | X | |
| 1 | 1 | | | | X | X | X | X | |
| 2 | 2 | X | X | X | | | | | X |
| 3 | 3 | | X | X | | X | | | X |
| 4 | 4 | X | | X | | | X | | X |
| 5 | 5 | | | X | | X | X | | X |
| 6 | 6 | X | X | | | | | X | X |
| 7 | 7 | | X | | | X | | X | X |
| 8 | 8 | X | | | | | X | X | X |
| 9 | 9 | | | | | X | X | X | X |

Switch I is a modified version of the Digitran Company switch model 2649 which has stops therein before dial setting four and after dial setting six and which is further modified to provide a visible indication in its window for only dial settings four and five with a blank for dial setting six. The 9's complemented BCD code generated by switch I is illustrated in TABLE V.

TABLE V

| DIAL SETTING | VISIBLE MARK | OUTPUT: COMMON "1" CONNECTED TO TERMINALS | | | | OUTPUT: COMMON "0" CONNECTED TO TERMINALS | | | |
|---|---|---|---|---|---|---|---|---|---|
| | | W1 | W2 | W4 | W8 | W1 | W2 | W4 | W8 |
| 0 | BLANK | | | | | | | | |
| 1 | BLANK | | | | | | | | |
| 2 | BLANK | | | | | | | | |
| 3 | BLANK | | | | | | | | |
| 4 | 4 | X | | X | | | X | | X |
| 5 | 5 | | | X | | X | X | | X |
| 6 | BLANK | X | X | | | | | X | X |
| 7 | BLANK | | | | | | | | |
| 8 | BLANK | | | | | | | | |
| 9 | BLANK | | | | | | | | |

In TABLES III, IV and V, the symbols W1, W2, W4 and W8 indicate the binary weight of the code bit involved. W1 = binary weight of one, W2 = binary weight of two, W4 = binary weight of four and W8 = binary weight of eight. These symbols are also utilized in FIGS. 4 and 5 to indicate the binary weight of the code bit being carried by the various conductors involved.

In the HI frequency band, divider 18 has a division factor N which is determined by the decimal number set in switches II-V minus a constant value 6,370. It should be noted that the two constants mentioned +1,500 and −6,370 have a 0 in the units position, therefore, no manipulation is required between the decimal coded output of switch V and the units decade counter of divider 18.

Decoder 20 includes binary adders 30 coupled to the output of switches II–IV, a 10,000 (10K) detector 31 coupled to the output of switch I and the IK output of adders 30. In addition decoder 20 includes a HI/LO band detector 32 which is coupled to predetermined weighted binary bits of the coded outputs of switches I and II to detect whether the frequency set in switches 19 is in the LO frequency band or in the HI frequency band. When detector 32 detects that the frequency set in switches 19 is in the LO band, detector 32 produces a binary signal which lights the decimal point between switches IV and V and in addition programs binary adders 30 to add the constant value 150 to the input from switches II–IV. When detector 32 detects that the frequency set in switches 19 is in the HI frequency band this detected HI band signal programs binary adders to subtract the constant value 637 from the inputs to adders 30 and also activates relay 29. Binary divider 22 includes a modulo-6 binary counter 33 and a HI/LO band selector 34. Selector 34 responds to the output of detector 32 when a LO frequency band is detected to pass the output of divider 18 directly to input 21*a* of phase detector 21. When detector 32 detects that the frequency selected is in the HI frequency band, selector 34 responds to this detected signal and causes the output of divider 18 to be further divided by a division factor of six in counter 33 prior to being coupled to input 21*a* in the phase detector 21.

Figure 4:
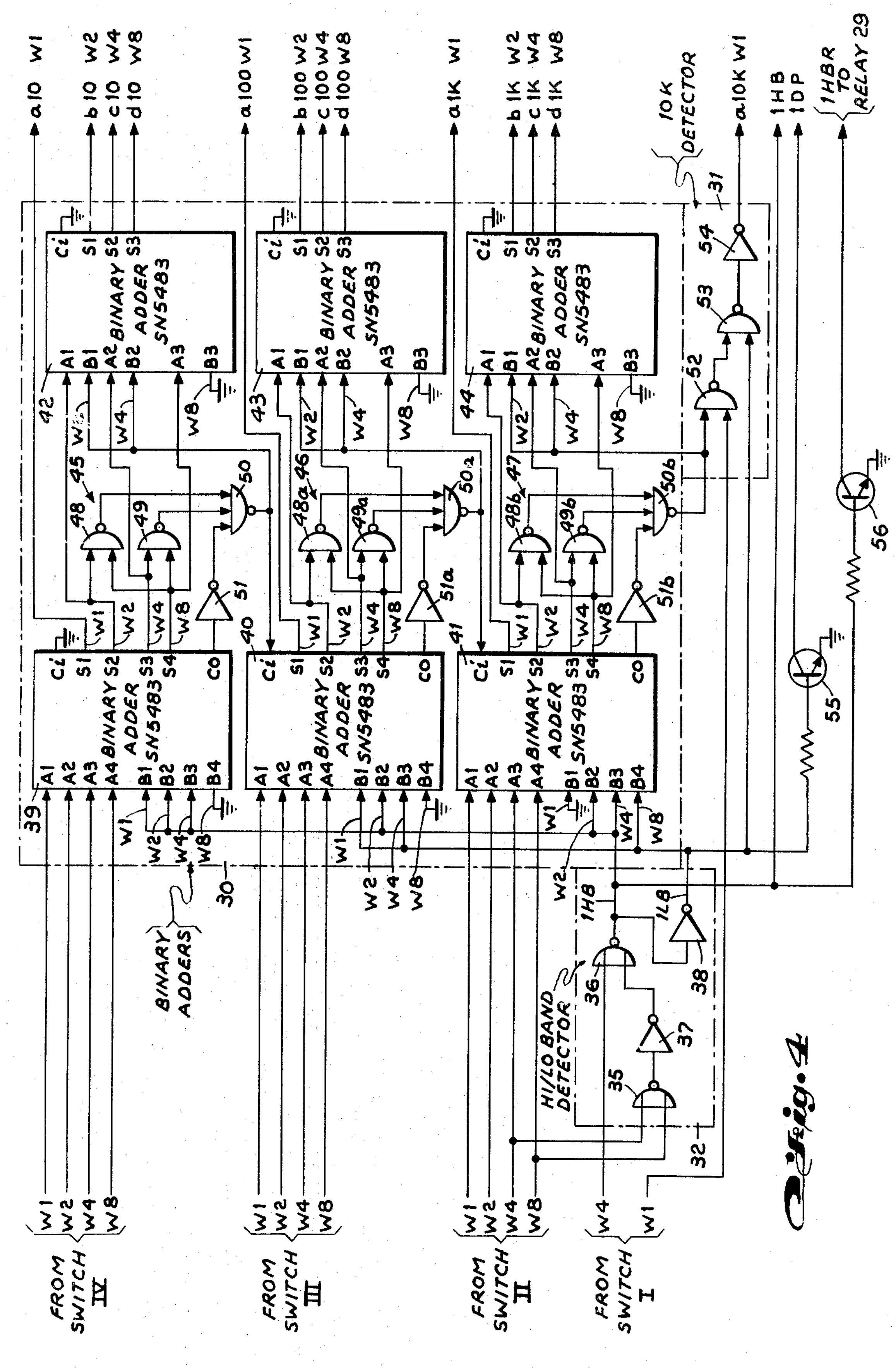
FIG. 4 is a logic diagram of one embodiment of the decoder of FIG. 2.

Referring to FIG. 4 there is illustrated therein one embodiment of the logic circuitry employed in decoder 20. Decoder 20 has coupled thereto inputs from switches I–IV and produces outputs for the 10's, 100's, 1,000's and 10,000's decade counters of divider 18 which will be discussed hereinbelow with reference to FIG. 5. In addition decoder 20 provides a HI/LO band signal identified as 1HB and two control signals identified as 1DP and 1HBR. The 1DP signal is a driving signal which when a binary "1" lights the decimal point between switches IV and V, while in the LO band mode, and the 1 HBR signal activates relay 29.

As mentioned hereinabove the thumbwheel switches I-V provide a standard 1248 9's complemented BCD coded output as illustrated in TABLE III above. This code is derived by subtracting the decimal digit appearing in the switch dial from nine and representing the remainder in binary code form. Also as mentioned hereinabove switch I is a special switch having only positions four and five with a blank position six for the HI band mode operation and stops in the switch to prevent dialing any other position.

Since W4 bit of the code produced by switch I is a binary "1" for the LO band mode, namely, when switch I is in position four or five, and a binary "0" for the HI band mode, namely, when switch I is in position six (note TABLE V), the W4 output can be decoded to tell which mode is being employed. This is accomplished in HI/LO band detector 32 in cooperation with the W4 and W8 bit outputs of switch II. Detector 32 includes NOR gate 35 having its two inputs coupled to the W4 and W8 bits of switch II. The W4 bit of switch I is connected as one input to NOR gate 36 which has its other input coupled to the output of NOR gate 35 through inverter 37. When the W4 and W8 bits of switch II are both binary "0" and the W4 bit of switch I is a binary "0" a HI mode operation is detected and a 1 HB signal is a binary "1" generated and inverter 38 provides a binary "0" for the 1 LB signal. It follows that when the binary condition of these bits of switches I and II reverse the 1 HB signal is a binary "0" and the 1 LB signal is a binary "1."

As mentioned hereinabove the output of switch V goes directly to the units decade counter of divider 18. The outputs from switches II–IV are operated on in the following manner to provide the required output for each frequency set in switches 19.

The decimal coded output from switch IV is coupled to binary adder 39, the coded decimal output of switch III is coupled to binary adder 40 and the coded decimal output of switch II is coupled to adder 41.

In the LO band mode operation, as mentioned hereinabove, the constant value 150 must be added to the number represented by the inputs from switches II–IV. Since the outputs from these switches are in a 9's complemented BCD code form there is actually added the constant value 840 to the inputs to adders 39, 40 and 41. Keeping in mind that in the LO mode operation the output from inverter 38 is a binary "1" and that a zero (the least significant digit) of 840 is added to the inputs of adder 39, the penultimate significiant weight digit in 9's complemented BCD form is added to the inputs of adder 40, and that the most significant digit in 9's complemented BCD form is added to the inputs of adder 41. To accomplish the addition of zero to the inputs from switch IV in adder 39 nothing is added as indicated by connections from the output of inverter 38 to the B inputs of adder 39. To add the 9's complemented BCD code equivalent of four to the inputs from switch III in adder 40 the output of inverter 38 is coupled to the W1 and W4 inputs (the B1 and B3 inputs) of adder 40 and the binary "0" condition of signal 1 HB is added to the W2 input (the B2 input) of adder 40 with the weight W8 input being grounded to provide a constant binary "0." This will in effect provide a code 1010 in ascending order of weights which as shown in TABLE III is equivalent to decimal four. In the same manner using the B inputs of binary adder 41 the 9's complemented BCD code version of decimal eight is added to the coded decimal input from switch II.

As is apparent a four bit BCD adder is required, but since only pure binary (modulo-16) adders are available in integrated circuit form, two binary adders for each switch plus additional gating is employed to produce a BCD addition. In other words, a second binary adder is provided for the inputs of each switch and is coupled to the first adder of each switch as illustrated. In other words, binary adder 42 is coupled as illustrated to binary adder 39, binary adder 43 is coupled to binary adder 40 as illustrated and binary adder 44 is coupled to binary adder 41 as illustrated. In addition logic gate circuits 45, 46, and 47 are provided between each pair of binary adders. Logic gate circuits 45, 46 and 47 are identical in structure in the embodiment illustrated and include NAND gates 48, 49 and 50 and inverters 51. The purpose of these logic gate circuits 45, 46 and 47 is to determine when the sum outputs of binary adders 39, 40 and 41 is greater than decimal nine. When the gates detect that the sum is greater than nine a binary "1" is produced which is applied to carry input Ci of the next binary adder or as an input to the 10K detector 31 as illustrated by the output of NAND gate 50*b*. The output of NAND gates 50 also provide the B inputs of weights W2 and W4 (inputs B1 and B2) for the associated one of binary adders 42, 43 and 44 so that the resultant code word produced by the W1 output taken directly from the first of the pair of adders and the W2, W4 and W8 output of the second binary adder of the pair has the proper value in 9's complemented BCD form to program divider 18 to achieve the required value for the division factor N to produce the frequency selected by switches 19 minus 70 MHz at the output of circulator 7 or 11.

As mentioned previously the output of NAND gate 50*b* is an input to the 10K detector 31 with the other inputs thereto being provided by the W1 bit of switch I and the 1 LB signal at the output of inverter 38. Detector 31 includes NAND gate 52 coupled to the output of NAND gate 50*b* and the W1 output of switch I. The output from NAND gate 52 is coupled to NAND gate 53 as one input thereof with the other input being provided by the output of inverter 38. The output of NAND gate 53 is coupled to inverter 54. Thus, when there is a binary "1" output of NAND gate 50*b* indicating a carry and W1 bit of switch I is a binary "0" which occurs in position 5 of switch I according to TABLE V the output of NAND gate 52 is a binary "1." When the output signal 1 LB is a binary "1" indicating a LO band mode of operation, the output of NAND gate 53 is a binary "0" which is converted to a binary " 1" by inverter 54. Thus, detector 31 will generate a binary "1" in the LO band mode which will enable programming divider 18 to produce a value of N between 10,000 and 11,500 as is required according to TABLE I.

In the HI band mode a function similar to that described hereinabove with respect to the addition of the constant value to the three adders 39, 40 and 41 is provided when the 1 HB signal is a binary "1" indicating a HI band mode operation and the 1 LB signal is a binary "0." The constant value as mentioned above is 637 which must be subtracted from the coded decimal outputs of switches II–IV. It can be shown that subtraction of two numbers in 9's complemented BCD can be implemented by changing the subtrahend (637) to a straight BCD code and adding. Therefore, the same set of adders 39, 40 and 41 is used to accomplish this addition so that the 1 HB signal in a binary "1" condition programs into the B inputs of adder 39 the BCD equivalent of decimal 7, programs into the B inputs of adder 40 the BCD equivalent of three and programs into the B inputs of binary adder 41 the BCD equivalent of six. The binary adders 39–44 and logic gate circuits 45–47 then operate as described hereinabove with respect to the LO band operation.

When the 1 LB signal at the output of inverter 38 is a binary "1" transistor 55 operates as a driver to light the decimal point between switches IV and V of switches 19 while transistor 56, when the output 1 HB of NOR gate 36 is a binary "1, " functions as a driver to activate relay 29.

It should be noted here that the arrangement shown for binary adders 30 employing two binary adders and the logic gate circuits can be simplified somewhat by changing the constant of addition to an excess -6 code. This removes the requirement for the complicated "carry" decoding scheme illustrated herein. If a carry-out is not detected from the first of the two coders, it is used to subtract the "excess-6" in the second adder by adding a constant equal to ten. Thus, only one inverter, such as inverter 51, is required and the NAND gates 48, 49 and 50 can be eliminated from each pair of adders.

Figure 5:
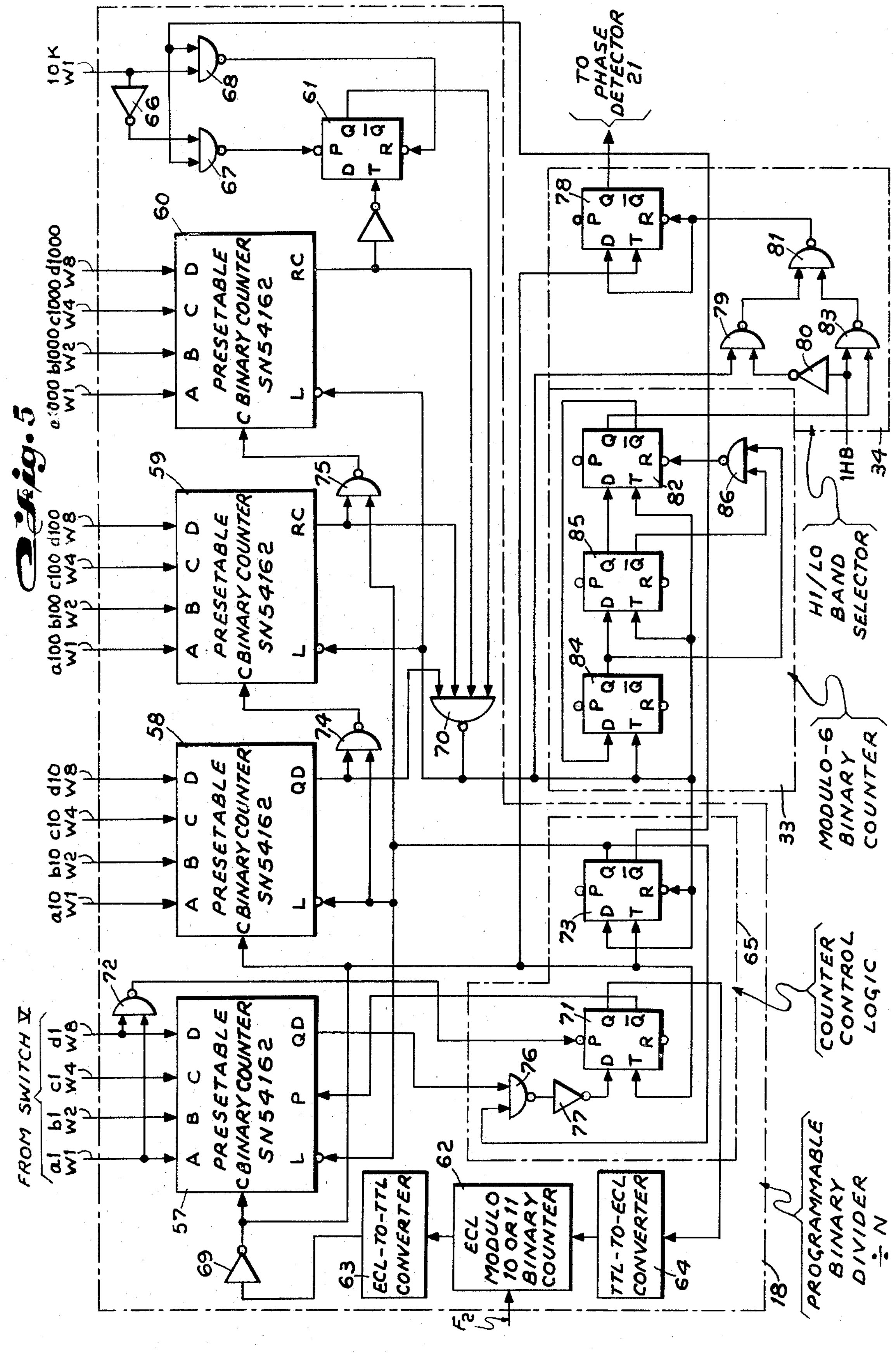
FIG. 5 is a logic diagram of one embodiment of the programmable binary divider, the modulo-6 binary counter and the HI/LO band selector of FIG. 2.

Referring to FIG. 5 there is illustrated therein the logic diagram of one embodiment of the programmable divider 18, the modulo - 6 counter 33 and the band selector 34. The logic components of programmable divider 18, modulo-6 counter 33 and band selector 34 employ TTL (transistor transistor logic). As illustrated in FIG. 5 divider 18 includes a presetable units binary counter 57, a 10's presetable binary counter 58, a 100's presetable binary counter 59, a 1,000's presetable binary counter 60 and one additional flip flop 61 for the 10,000 count when required. Divider 18 also includes a modulo 10 or a modulo 11 binary counter 62 employing ECL (emitter coupled logic) coupled to the signal input where the signal input has a frequency F2. Counter 62 is a high speed ECL device and requires interface circuitry such as ECL-to-TTL converter 63 and TTL-to-ECL converter 64 between the prescale counter 62 and the counters 57–61 and the counter control logic 65. Converter 63 is basically a non-saturated differential amplifier and converter 64 is a simple resistor divider network. Counter 62 may be a Fairchild ECL counter model 95H90 which is fully described in the "Fairchild Easy ECL Catalog," May 1971 published by Fairchild.

Counter 57 is coupled directly to switch V, counter 58 is coupled to the outputs of adders 39 and 42, counter 59 is coupled to the outputs of adders 40 and 43, counter 60 is coupled to the outputs of adders 41 and 44 and flip flop 61 is coupled to the output of inverter 54 through means of inverter 66 and NAND gates 67 and 68.

The use of the modulo 10/11 prescale counter 62 along with common clocking of counters 57 and 58 through means of inverter 69 is referred to as a "swallow" counter. In this arrangement, counters 57–60 are preset to the 9's complement of the required count ratio or division factor N and when the count of 9999 is reached as detected by NAND gate 70, counters 57–60 are again preset to the 9's complemented input to counters 57–60. The unique feature of the swallow counter is that when the units decade, counter 57, is preset to any number other than nine, the Q output of flip flop 71 of control logic 65 sets counters 62 into a modulo-11 counting mode. Each pulse into counters 57 and 58 then represents one count of 11, and both the units and 10's decades, counters 57 and 58 are upped one count ($10 + 1 = 11$). When counter 57 is full, control logic 65 switches the Q output of 71 so that counter 62 operates in a modulo-10 mode and each of the succeeding input pulses from inverter 69 steps counter 58 and the units counter 57 is inhibited by the $\overline{Q}$ output of flip flop 71 from any further counting. It should be noted that, if counter 57 is initially loaded to nine (full), counter 62 always operates in the modulo-10 mode. This is controlled by the input to flip flop 71 from NAND gate 72.

Flip flop 73 controls the loading of counters 57 and 58 directly and the clocking of counters 59 and 60 through NAND gates 74 and 75. The loading of counters 59 and 60 is controlled through means of NAND gate 70. Flip flo 73 of control logic 65 also controls the operation of flip flop 71 through NAND gate 76 and inverter 77 with both of the flip flops 71 and 73 being clocked or triggered by the output of inverter 69 which also is the input to counters 57 and 58.

A single flip flop 61 is required for the 10,000 decade counter since in this application count ratios of 755 to 11,500 are required. Of course, additional decades could be added along with additional count selecting switches and required decoding logic.

When all the decade counters 57–60 are full and flip flop 61 is set the logic circuitry goes into a reset mode. This is controlled by the output of NAND gate 70. Actually, a count of eight (output QD) is used at counter 58 to "anticipate" the full count which would occur at the next clock pulse, but this time is required to perform the actual loading of the parallel inputs to the counter.

Similarly, the count of eight (output QD) of units counter 57, when used, anticipates the next clock pulse and flip flop 71 through NAND gate 76 and inverter 77 is used to control the modulus of the prescaler counter 62. This arrangement provides less "turn-around" delay then would result if the RC output (count $= 9$) of the units and 10's counters 57 and 58 were used. If greater speed were required, an ECL flip flop could also be used.

The output from flip flop 78 to phase detector 21 comes when the reset pulse of the counter at the output of NAND gate 70 through NAND gate 79 when the 1 HB signal is a binary "0" which indicates a LO band mode of operation. This binary "0" is converted to a binary "1" in inverter 80 to provide the desired output from NAND gate 79 which is coupled through NAND gate 81 to the reset R and D inputs of flip flop 78. When the 1 HB signal is a binary "1" indicating a HI band mode of operation the output from flip flop 82 of the modulo-6 counter 33 is coupled through NAND gate 83 to NAND gate 81 and, hence, to the reset R and D inputs of flip flop 78.

As illustrated, counter 33, the modulo - 6 counter, includes three flip flop stages 84, 85 and 82 with an input from NAND gate 70 and a feedback from the $\overline{Q}$ output of flip flop 82 to the D input of flip flop 84 and a reset input to flip flop 82 through NANd gate 86 which receives its inputs from the Q output of flip flop 84 and the $\overline{Q}$ output of flip flop 85 so that the three stages of flip flops which normally would count to eight is now forced to count only to six.

The "swallow" technique described herein uses an additional counter stage, counter 62, but gives the advantage of being able to count at speed in excess of 100 MHz while using only one ECL integrated circuit. The TTL counters 57–60 run at 1/10 or 1/11 of the HI speed input frequency.

Of course, the basic decoding system described can be used with any type of programmable counter, including one built with all ECL components. Also, more than two bands of frequencies could be incorporated into the basic decoding scheme.

It will be noted in FIGS. 4 and 5 that a number appears in the adder blocks and the counter blocks having a prefix SN. These numbers identify the model number of an integrated circuit adder or counter manufactured by Texas Instruments which is fully described in Texas Instruments Publications, "Integrated Circuits Catalog for Design Engineers", First Edition.

While we have described above the principles of our invention in connection with specific apparatus it is to be clearly understood that this description is made only by way of example and not as a limitation to the scope of our invention as set forth in the objects thereof and in the accompanying claims.

We claim:

1. A frequency synthesizer to generate one at a time a plurality of first signals each having a different selected frequency in each of a plurality of different frequency bands comprising:

a voltage controlled oscillator capable of generating one at a time a plurality of second signals each having a different frequency in a given frequency band common to and predeterminedly related to said plurality of different frequency bands, the frequencies of said second signals being predeterminedly related to the frequencies of said first signals in each of said plurality of different frequency bands;

first means coupled to the output of said oscillator to frequency multiply the output signal of said oscillator by a plurality of different multiplication factors to provide one at a time said plurality of first signals in each of said plurality of different frequency bands; and a single phase locked loop coupled between the input and output of said voltage controlled oscillator to control the generation of said plurality of second signals;

said phase locked loop including second means coupled between the input and the output of said oscillator to divide the output signal of said oscillator by a plurality of different division factors to select the frequency of each of said first signals at the output of said first means, the frequencies of said first signals having a different constant incremental frequency step in each of said plurality of frequency bands;

said first means including a plurality of series circuits each having a frequency multiplier and a band pass filter coupled in series with each other and to the output of said voltage controlled oscillator, said series circuits being equal in number to said plurality of different frequency bands, each of said frequency multipliers having a different multiplication factor, and each of said series circuits defining a different one of said plurality of different frequency bands; and said second means further selecting a desired one of said plurality of different frequency bands as defined by an appropriate one of said series circuits.

2. A frequency synthesizer according to claim 1, further including an automatic level control circuit having a level controlled amplifier coupled between the output of said voltage controlled oscillator and each of said frequency multipliers, a plurality of level detectors each coupled to the output of a different one of said band pass filters, each of said level detectors producing a control signal proportional to the amplitude of the output signal of an associated one of said band pass filters, a control signal amplifier having its output coupled to a control input of said level controlled amplifier for amplitude control in accordance with a selected one of said control signals, and a switch controlled by said second means coupled between the input of said control signal amplifier and the output of said level detectors.

3. A frequency synthesizer according to claim 2, wherein said phase locked loop includes a reference signal oscillator generating a signal having a predetermined frequency, a first frequency divider coupled to the output of said reference oscillator to divide said predetermined frequency by a first given division factor, a phase detector having a first input and a second input, said first input being coupled to the output of said first frequency divider, a reference signal frequency multiplier coupled to the output of said reference oscillator to multiply said predetermined frequency by a given multiplication factor, a mixer coupled to the output of said level controlled amplifier and the output of said reference signal frequency multiplier, a second frequency divider coupled to the output of said mixer to divide the frequency of the output signal of said mixer by a second given division factor different than said first given division factor, said second means coupled between the output of said second frequency divider and said second input of said phase detector, and a low pass loop filter coupled between the output of said phase detector and a control input of said voltage controlled oscillator.

4. A frequency synthesizer according to claim 3, wherein said second means includes a programmable frequency divider having a programmed division factor equal to N, where N is a programmed integer.

5. A frequency synthesizer according to claim 4, wherein

N has a different range of values for each of said plurality of different frequency bands.

6. A frequency synthesizer according to claim 5, wherein said second means further includes a third frequency divider coupled between the output of said programmable frequency divider and said second input of said phase detector, said third frequency divider having a selected one of a plurality of division factors, said selected one of said plurality of division factors being determined by said desired one of said plurality of different frequency bands.

7. A frequency synthesizer according to claim 6, wherein said first, second, third and programmable frequency dividers are binary frequency dividers.

8. A frequency synthesizer according to claim 7, wherein said second means further includes third means to program said programmable frequency divider to achieve a desired value of N, to select a desired division factor for said third frequency divider and to select said desired one of said plurality of different frequency bands.

9. A frequency synthesizer according to claim 8, wherein said third means includes a plurality of frequency selecting switches, each of said switches generating a 9's complemented binary coded decimal signal representing the decimal value to which each of said switches are set, said coded signal from the least significant of said switches being coupled directly to said programmable frequency divider to program a first portion of said programmable frequency divider;

a frequency band detector coupled to a predetermined number of the most significant of said switches to produce a band selection signal indicating which one of said plurality of different frequency bands said switches have selected;

a selection circuit coupled to the output of said programmable frequency divider and the output of said third frequency divider to divide the output signal from said programmable frequency divider by a division factor of said third frequency divider as selected by said band selection signal;

binary adder means coupled to each of said switches between said least significant and said most significant switch to add a different constant value in digital form for each of said plurality of different frequency bands under control of said band selection signal to said 9's complemented binary coded decimal signal coupled to said binary adder means, the resultant digital output from said binary adder means being coupled to said programmable frequency divider to program a second portion of said programmable frequency divider; and a detector coupled to said most significant one of said switches; at least one output of said binary adder means and said programmable frequency divider to produce a signal to program a third portion of said programmable frequency divider;

the programming of said first, second and third portions of said programmable frequency divider determining the value of said division factor N.

10. A frequency synthesizer according to claim 9, wherein said 9's complemented binary coded decimal signal from each of said switches includes four binary bits;

said plurality of different frequency bands include a first frequency band, and a second frequency band;

said plurality of frequency selecting switches include a first frequency selecting switch which is the most significant switch, a second frequency selecting switch which is the next most significant switch, a third frequency selecting switch which is the next most significant switch, a fourth frequency selecting switch which is the next most significant switch, and a fifth frequency selecting switch which is the least significant switch; and said plurality of division factors of said third frequency divider equals one for said first frequency band and an integral M greater than one for said second frequency band.

11. A frequency synthesizer according to claim 10, wherein said frequency band detector includes a first logic gate circuit coupled to said first and second switches responding to the binary condition of the penultimate significant weight bit of said coded decimal signal from said first switch and to the binary condition of the most significant and penultimate significant weight bits of said coded decimal signal from said second switch to produce a first binary signal representing said first frequency band and a second binary signal representing said second frequency band.

12. A frequency synthesizer according to claim 11, wherein said binary adder means includes a first binary adder coupled to said fourth switch and said first logic gate circuit to add a first digital signal representing the least significant decimal of a first constant value to said coded decimal signal from said fourth switch when said second binary signal is a binary "1" and said first binary signal is a binary "0" and to add a second digital signal representing the least significant decimal of a second constant value different than said first constant value to said coded decimal signal from said fourth switch when said first binary signal is a binary "1" and said second binary signal is a binary "0";

a second logic gate circuit coupled to a carry output and each of the three most significant sum bits of said first binary adder to provide a binary "1" output when a coded output of said first binary adder is greater than nine;

a second binary adder coupled to said second logic gate circuit and said first binary adder responding to the three most significant sum bits of said first binary adder and the binary condition of the output signal of said second logic gate circuit to produce the three most significant weight bits of a first program word, the least significant weight bit of said first program word being provided directly from said first binary adder;

a third binary adder coupled to said third switch, said first logic gate circuit and said second logic gate circuit to add a third digital signal representing the penultimate most significant decimal of said first constant value to said coded decimal signal from said third switch when said second binary signal is a binary "1" and said first binary signal is a binary "0" and to add a fourth digital signal representing the penultimate most significant decimal of said second constant value to said coded decimal signal from said third switch when said first binary signal is a binary "1" and said second binary signal is a binary "0";

a third logic gate coupled to a carry output and each of the three most significant sum bits of said third binary adder to provide a binary "1" output when a coded output of said third binary adder is greater than nine;

a fourth binary adder coupled to said third logic gate circuit and said third binary adder responding to the three most significant sum bits of said third binary adder and the binary condition of the output signal of said third logic gate circuit to produce the three most significant weight bits of a second program word, the least significant weight bit of said second program word being provided directly from said third binary adder;

a fifth binary adder coupled to said second switch, said first logic gate circuit and said third logic gate circuit to add a fifth digital signal representing the most significant decimal of said first constant value to said coded decimal signal from said second switch when said second binary signal is a binary "1" and said first binary signal is a binary "0" and to add a sixth digital signal representing the most significant decimal of said second constant value to said coded decimal signal from said second switch when said first binary signal is a binary "1" and said second binary signal is a binary "0";

a fourth logic gate circuit coupled to a carry output and each of the three most significant sum bits of said fifth binary adder to provide a binary "1" output when a coded output of said fifth binary adder is greater than nine; and a sixth binary adder coupled to said fourth logic gate circuit and said fifth binary adder responding to the three most significant sum bits of said fifth binary adder and the binary condition of the output signal of said fourth logic gate circuit to produce the three most significant weight bits of a third program word, the least significant weight bit of said third program word being provided directly from said fifth binary adder.

13. A frequency synthesizer according to claim 12, wherein said detector includes a fifth logic gate circuit coupled to said fourth logic gate circuit, said first switch and said first logic gate circuit to produce a fourth program word having only a least significant weight bit.

14. A frequency synthesizer according to claim 13, wherein said third frequency divider includes a modulo M counter coupled to said programmable frequency divider, wherein M is an integer; and said selection circuit includes a sixth logic gate circuit coupled to said programmable frequency divider, said modulo M counter and said first logic gate circuit responding to said second binary signal to couple the output of said programmable frequency divider directly to said phase detector when said second binary signal is a binary "0" and to couple the output of said programmable frequency divider to said modulo M counter prior to coupling to said phase detector when said second binary signal is a binary "1."

15. A frequency synthesizer according to claim 14, wherein said programmable frequency divider includes a units four stage decade presetable binary counter coupled directly to said fifth switch and preset by said coded decimal signal from said fifth switch;

a tens four stage decade presetable binary counter coupled to said first and second binary adders and preset by said first program word;

a hundreds four stage decade presetable binary counter coupled to said tens binary counter and said third and fourth binary adders and preset by said second program word;

a thousands four stage decade presetable binary counter coupled to said hundreds binary counter and said fifth and sixth binary adders and preset by said third program word;

a bistable device coupled to said thousands binary counter and said fifth logic gate circuit preset by said fourth program word;

a prescaler binary counter coupled between said second frequency divider and said units and tens binary counter, said prescaler binary counter having one of two division factors; and a counter control circuit coupled to said units, tens, hundreds and thousands binary counters to control the counting thereof and coupled to said prescaler binary counter and said units binary counter to control the selection of the division factor of said prescaler binary counter.

16. A frequency synthesizer according to claim 15, wherein said modulo-M counter, said counter control circuit, said units, tens, hundreds and thousands binary counters and said bistabale devices include transistor transistor logic, and said prescaler binary counter includes emitter coupled logic; and further including an emitter coupled logic-to-transistor transistor logic converter coupled to the output of said prescaler binary counter, and a transistor transistor logic-to-emitter coupled logic converter coupled between a control input of said prescaler binary counter and said counter control circuit.

17. A frequency synthesizer according to claim 1, further including an automatic level control circuit having a level controlled amplifier coupled between the output of said voltage controlled oscillator and the input of said first means, a plurality of level detectors coupled to the output of said first means, each of said level detectors producing a control signal proportional to the amplitude of the output signal of an associated one of said plurality of different frequency bands, a control signal amplifier having its output coupled to a control input of said level controlled amplifier for amplitude control in accordance with a selected one of said control signals, and a switch controlled by said second means coupled between the input of said control signal amplifier and the output of said level detectors.

18. A frequency synthesizer according to claim 17, wherein said phase locked loop includes a reference signal oscillator generating a signal having a predetermined frequency, a first frequency divider coupled to the output of said reference oscillator to divide said predetermined frequency by a first given division factor, a phase detector having a first input and a second input, said first input being coupled to the output of said first frequency divider, a reference signal frequency multiplier coupled to the output of said reference oscillator to multiply said predetermined frequency by a given multiplication factor, a mixer coupled to the output of said level controlled amplifier and the output of said reference signal frequency multiplier, a second frequency divider coupled to the output of said mixer to divide the frequency of the output signal of said mixer by a second given division factor different than said first given division factor, said second means coupled between the output of said second frequency divider and said second input of said phase detector, and a low pass loop filter coupled between the output of said phase detector and a control input of said voltage controlled oscillator.

19. A frequency synthesizer according to claim 1, wherein said phase locked loop includes a reference signal oscillator generating a signal having a predetermined frequency, a first frequency divider coupled to the output of said reference oscillator to divide said predetermined frequency by a first given division factor, a phase detector having a first input and a second input, said first input being coupled to the output of said first frequency divider, a reference signal frequency multiplier coupled to the output of said reference oscillator to multiply said predetermined frequency by a given multiplication factor, a mixer coupled to the output of said voltage controlled oscillator and the output of said reference signal frequency multiplier, a second frequency divider coupled to the output of said mixer to divide the frequency of the output signal of said mixer by a second given division factor different than said first given division factor, said second means coupled between the output of said second frequency divider and said second input of said phase detector, and a low pass loop filter coupled between the output of said phase detector and a control input of said voltage controlled oscillator.

20. A frequency synthesizer according to claim 1, wherein said second means includes a programmable frequency divider having a programmed division factor equal to N, where N is a programmed integer.

21. A frequency synthesizer according to claim 20, wherein

N has a different range of values for each of said plurality of different frequency bands.

22. A frequency synthesizer according to claim 21, wherein said second means further includes a frequency divider coupled to the output of said programmable frequency divider, said frequency divider having a selected one of a plurality of division factors, said selected one of said plurality of division factors being determined by said desired one of said plurality of different frequency bands.

23. A frequency synthesizer according to claim 22, wherein said frequency divider and said programmable frequency divider are binary frequency dividers.

24. A frequency synthesizer according to claim 23, wherein said second means further includes third means to program said programmable frequency divider to achieve a desired value of N, to select a desired division factor for said frequency divider and to select said desired one of said plurality of different frequency bands.

25. A frequency synthesizer according to claim 24, wherein said third means includes a plurality of frequency selecting switches, each of said switches generating a 9's complemented binary coded decimal signal representing the decimal value to which each of said switches are set, said coded signal from the least significant of said switches being coupled directly to said programmable frequency divider to program a first portion of said programmable frequency divider;

a frequency band detector coupled to a predetermined number of the most significant of said switches to produce a band selection signal indicating which one of said plurality of different frequency bands said switches have selected;

a selection circuit coupled to the output of said programmable frequency divider and the output of said frequency divider to divide the output signal from said programmable frequency divider by a division factor of said frequency divider as selected by said band selection signal;

binary adder means coupled to each of said switches between said least significant and said most significant switch to add a different constant value in digital form for each of said plurality of different frequency band under control of said band selection signal to said 9's complemented binary coded decimal signal coupled to said binary adder means, the resultant digital output from said binary adder means being coupled to said programmable frequency divider to program a second portion of said programmable frequency divider; and a detector coupled to said most significant one of said switches, at least one output of said binary adder means and said programmable frequency divider to produce a signal to program a third portion of said programmable frequency divider;

the programming of said first, second and third portions of said programmable frequency divider determining the value of said devision factor N.

26. A frequency synthesizer according to claim 25, wherein said 9's complemented binary coded decimal signal from each of said switches includes four binary bits;

said plurality of different frequency bands include a first frequency band, and a second frequency band;

said plurality of frequency selecting switches includes a first frequency selecting switch which is the most significant switch, a second frequency selecting switch which is the next most significant switch, a third frequency selecting switch which is the next most significant switch, a fourth frequency selecting switch which is the next most significant switch, and a fifth frequency selecting switch which is the least significant switch; and said plurality of division factors of said frequency divider equals one for said first frequency band and an integral M greater than one for said second frequency band.

27. A frequency synthesizer according to claim 26, wherein said frequency band detector includes a first logic gate circuit coupled to said first and second switches responding to the binary condition of the penultimate significant weight bit of said coded decimal signal from said first switch and to the binary condition of the most significant and penultimate significant weight bits of said coded decimal signal from said second switch to produce a first binary signal representing said first frequency band and a second binary signal representing said second frequency band.

28. A frequency synthesizer according to claim 27, wherein said binary adder means includes a first binary adder coupled to said fourth switch and said first logic gate circuit to add a first digital signal representing the least significant decimal of a first constant value to said coded decimal signal from said fourth switch when said second binary signal is a binary "1" and said first binary signal is a binary "0" and to add a second digital signal representing the least significant decimal of a second constant value different than said first constant value to said coded decimal signal from said fourth switch when said first binary signal is a binary "1" and said second binary signal is a binary "0;"

a second logic gate circuit coupled to a carry output and each of the three most significant sum bits of said first binary adder to provide a binary "1" output when a coded output of said first binary adder is greater than nine;

a second binary adder coupled to said second logic gate circuit and said first binary adder responding to the three most significant sum bits of said first binary adder and the binary condition of the output signal of said second logic gate circuit to produce the three most significant weight bits of a first program word, the least significant weight bit of said first program word being provided from said first binary adder;

a third binary adder coupled to said third switch, said first logic gate circuit and said second logic gate circuit to add a third digital signal representing the penultimate most significant decimal of said first contant value to said coded decimal signal from said third switch when said second binary signal is a binary "1" and said first binary signal is a binary "0" and to add a fourth digital signal representing the penultimate most significant decimal of said second constant value to said coded decimal signal from said third switch when said first binary signal is a binary "1" and said second binary signal is a binary "0";

a third logic gate coupled to a carry output and each of the three most significant sum bits of said third binary adder to provide a binary "1" output when a coded output of said third binary adder is greater than nine;

a fourth binary adder coupled to said third logic gate circuit and said third binary adder responding to the three most significant sum bits of said third binary adder and the binary condition of the output signal of said third logic gate circuit to produce the three most significant weight bits of a second program word, the least significant weight bit of said second program word being provided directly from said third binary adder;

a fifth binary adder coupled to said second switch, said first logic gate circuit and said third logic gate circuit to add a fifth digital signal representing the most significant decimal of said first constant value to said coded decimal signal from said second switch when said second binary signal is a binary "1" and said first binary signal is a binary "0" and to add a sixth digital signal representing the most significant decimal of said second constant value to said coded decimal signal from said second switch when said first binary signal is a binary "1" and said second binary signal is a binary "0";

a fourth logic gate circuit coupled to a carry output and each of the three most significant sum bits of said fifth binary adder to provide a binary "1" output when a coded output of said fifth binary adder is greater than nine; and a sixth binary adder coupled to said fourth logic gate circuit and said fifth binary adder responding to the three most significant sum bits of said fifth binary adder and the binary condition of the output signal of said fourth logic gate circuit to produce the three most significant weight bits of a third program word, the least significant weight bit of said third program word being provided directly from said fifth binary adder.

29. A frequency synthesizer according to claim 28, wherein said detector includes a fifth logic gate circuit coupled to said fourth logic gate circuit, said first switch and said first logic gate circuit to produce a fourth program word having only a least significant weight bit.

30. A frequency synthesizer according to claim 29, wherein said frequency divider includes a modulo M counter coupled to said programmable frequency divider, wherein M is an integer;

said selection circuit includes a sixth logic gate circuit coupled to said programmable frequency divider, said modulo M counter and said first logic gate circuit responding to said second binary signal to couple the output of said programmable frequency divider directly to the output of said second means when said second binary signal is a binary "0" and to couple the output of said programmable frequency divider to said modulo M counter prior to coupling to the output of said second means when said second binary signal is a binary "1".

31. A frequency synthesizer according to claim 30, wherein said programmable frequency divider includes a units four stage decade presetable binary counter coupled directly to said fifth switch and preset by said coded decimal signal from said fifth switch;

a tens four stage decade presetable binary counter coupled to said first and second binary adders and preset by said first program word;

a hundreds four stage decade presetable binary counter coupled to said tens binary counter and said third and fourth binary adders and preset by said second program word;

a thousands four stage decade presetable binary counter coupled to said hundreds binary counter and said fifth and sixth binary adders and preset by said third program word;

a bistable device coupled to said thousands binary counter and said fifth logic gate circuit preset by said fourth program word;

a prescaler binary counter coupled between said second frequency divider and said units and tens binary counter, said prescaler binary counter having one of two division factors; and a counter control circuit coupled to said units, tens, hundreds and thousands binary counters to control the counting thereof and coupled to said prescaler binary counter and said units binary counter to control the selection of the division factor of said prescaler binary counter.

32. A frequency synthesizer according to claim 31, wherein said modulo-M counter, said counter control circuit, said units, tens, hundreds and thousands binary counters and said bistable devices include transistor transistor logic, and said prescaler binary counter includes emitter coupled logic; and further including an emitter coupled logic-to-transistor transistor logic converter coupled to the output of said prescaler binary counter, and a transistor transistor logic-to-emitter coupled logic converter coupled between a control input of said prescaler binary counter and said counter control circuit.

* * * * *